United States Patent [19]
Lin

[11] Patent Number: 5,978,219
[45] Date of Patent: Nov. 2, 1999

[54] HEAT DISSIPATING DEVICE

[76] Inventor: Liken Lin, 35 Chung-Yang Rd. Sec. 4, Tu-Cheng City, Taipei Hsien, Taiwan

[21] Appl. No.: 09/036,670

[22] Filed: Mar. 9, 1998

[51] Int. Cl.$^6$ ....................................................... H05K 7/20
[52] U.S. Cl. ........................... 361/697; 165/80.3; 361/703
[58] Field of Search ........................... 454/184; 165/80.3, 165/120–126; 257/722; 174/16.3, 16.1; 361/690, 694, 695, 697, 703, 687, 710, 722, 717–719; 415/177, 178, 213.1, 214.1; 364/708.1

[56] References Cited

U.S. PATENT DOCUMENTS

| | | |
|---|---|---|
| 5,285,347 | 2/1994 | Fox . |
| 5,422,787 | 6/1995 | Gourdine . |
| 5,428,503 | 6/1995 | Matsushima . |
| 5,535,094 | 7/1996 | Nelson . |
| 5,559,674 | 9/1996 | Katsui . |
| 5,816,319 | 10/1998 | Kamekawa . |

Primary Examiner—Gerald Tolin
Attorney, Agent, or Firm—Smith, Gambrell & Russell, LLP; Beveridge, DeGrandi, Weilacher & Young Intellectual Property Group

[57] ABSTRACT

A heat dissipating device for CPU generally comprises a bracket, a cooling fan, a specially designed air hose that connects the inlet of the cooling fan and the inlet of the computer housing, and an upper lid. The specially designed air hose is connected to the inlet of the cooling fan. The other end of the hose is arranged such that it may draw the fresh air into the computer housing. The bracket is preferably made from aluminum and can be properly mounted onto the top surface of the CPU. When the cooling fan operates, the cooling air can be readily sucked and directed to the mounting recess of the bracket. The heat built-up resulted from the operation of CPU can be readily dissipated by those introduced airflow. When the airflow passes through the heat dissipating fins, the heat from the CPU can be effectively dissipated.

2 Claims, 3 Drawing Sheets

HEAT DISSIPATING DEVICE

FIELD OF THE INVENTION

The present invention relates to a heat dissipating device, more particularly, to a heat dissipating device for central processing unit (CPU). The dissipating device features an inlet that is remote from the cooling fan that is directly disposed above the CPU. The dissipating device is provided with a channel with which the fresh and cool air can be readily drawn in when the cooling fan operates. As a result, the CPU can be properly cooled.

DESCRIPTION OF PRIOR ART

By the benefit of the advanced technology in computer, the performance of the personal computer has also become more and more powerful. In order to ensure a proper operation of the CPU, the working temperature shall be controlled within a given range. Normally, the CPU is mounted with a cooling fan that blows cool air directly toward the upper surface of the CPU. Gradually, a plurality of heat dissipating devices has been introduced. In one of the existing heat dissipating device, the cooling fan and the inlet is offset or distant from each other. This design has poor cooling effect.

As the CPU becomes more and more powerful, the heat dissipating device is also required to conform to the design of the CPU as well as the housing. As shown in FIG. 1, the cooling air can not be effectively drawn in to cool the CPU. As a result, if no cool air is drawn in, the heat generated by the CPU can not be effectively dissipated.

SUMMARY OF THE INVENTION

It is the objective of this invention to provide a heat dissipating device wherein the cool air can be effectively drawn in to cool or balance the heat generated by the CPU.

According one aspect of the present invention, the cooling fan and the inlet of the heat dissipating device are offset from each other while the cooling air can be effectively introduced to cool the CPU or lower the working temperature of the CPU.

In order to achieve the objective set forth, the heat dissipating device made according to the present invention generally comprises a bracket, a cooling fan, a specially designed air channel, and an upper lid. The bracket can be readily placed onto the upper surface of the CPU via conventional manner. One end of the bracket is provided with a plurality of traverse fins that define a plurality of air channels thereof. The other end of the bracket is provided with a recess for mounting the cooling fan thereof. One end of the air channel extends to the upper position of the cooling fan and the cooling fan is connected thereof. The other end of the air channel is defined as an inlet and arranged in a manner such that it may communicate with fresh air.

Accordingly, when the cooling fan operates, the cool air can be drawn in from the other end of the air channels. This airflow will effectively drawn into the air channel and mixed with the heat from the CPU. Consequently, the heat generated by the CPU can be effectively dissipated by the cool airflow.

According to one aspect of the present invention, when the air inlet is remote from the cooling fan or the air inlet can not be directly connected with the mounting recess for cooling fan, a specially designed air charnel shall be provided to effectively cool down the CPU.

BRIEF DESCRIPTION OF DRAWINGS

In order that the present invention may more readily be understood the following description is given, merely by way of example with reference to the accompanying drawings, in which.

DETAILED DESCRIPTION OF PREFERRED EMBODIMENT

Figure 1:
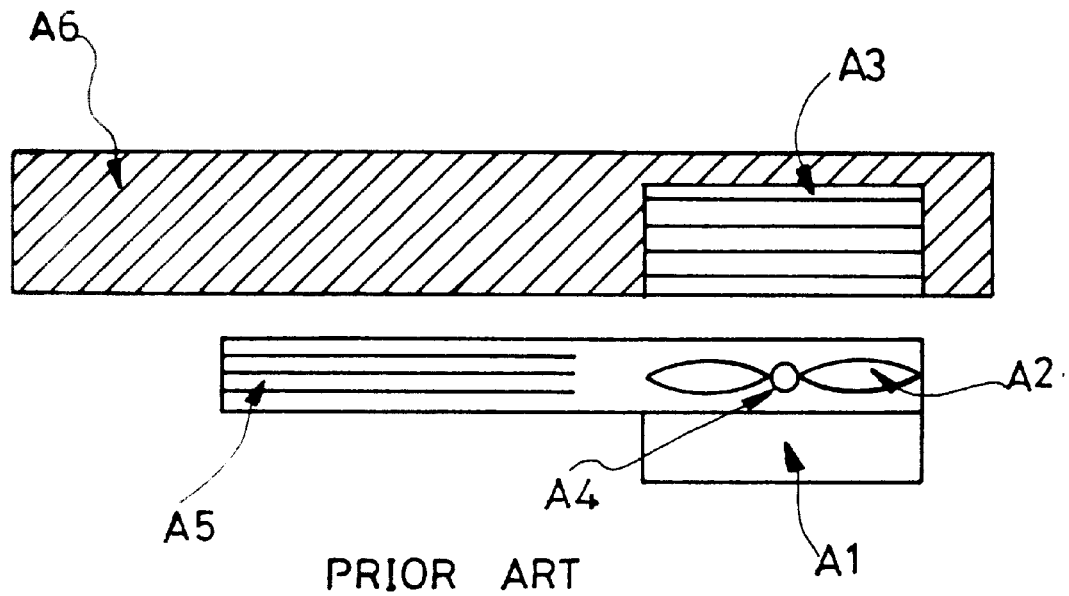
FIG. 1 is a side elevational view showing a conventional heat dissipating device that is disposed on a CPU.

Referring to FIG. 1, a conventional heat dissipating device is shown. The mounting position of this conventional heat dissipating device is remote from the inlet A3 of the computer housing A6. Accordingly, it is hard to suck the fresh air into the computer housing. In an alternative, the conventional heat dissipating device is provided with a larger distance in the middle position. With the operation of the cooling fan A2, the cooling air from the inlet A3 of the computer housing A6 can be supplied to the mounting recess A4. Then the heated air is discharged through the bracket A5 of the heat dissipating device. However, no air channels are provided between the inlet A3 and the mounting recess A4 of the cooling fan, the fresh air drawn through the inlet A3 of the housing A6 will distribute all around and is not focused on the mounting recess A4. Only part of the fresh air is directed to the mounting recess A4 by the operation of the cooling fan A2. In light of this, it is hard to achieve the intended cooling effect.

Figure 2:
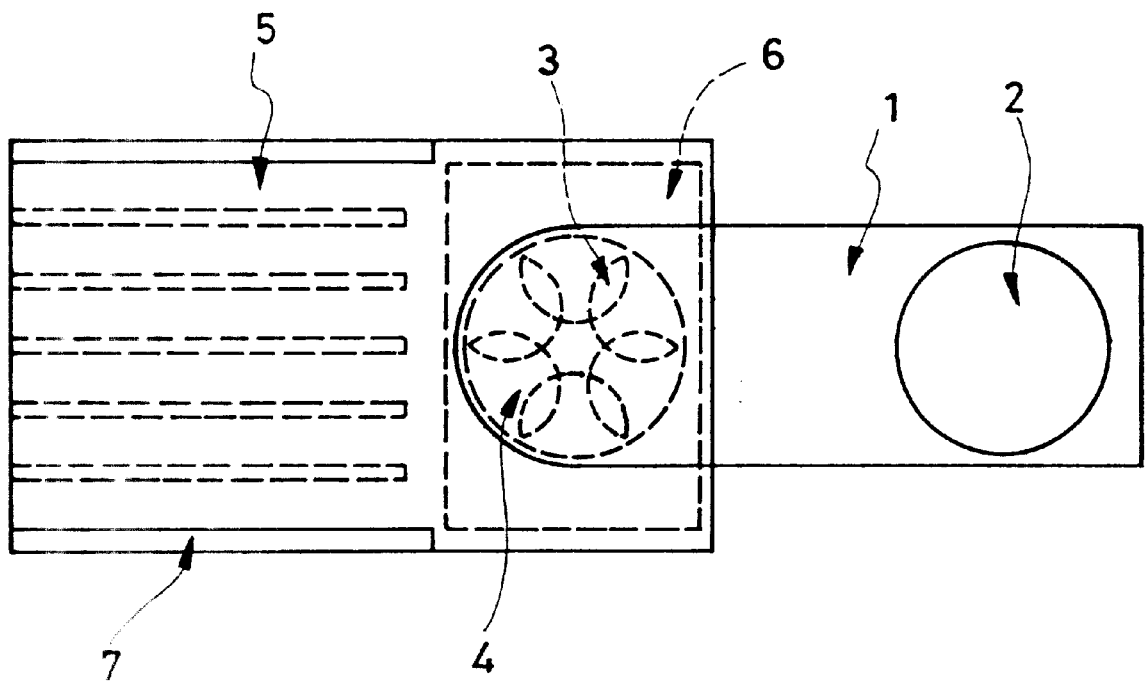
FIG. 2 is a top plan view showing the heat dissipating device is arranged onto the CPU.
Figure 3:
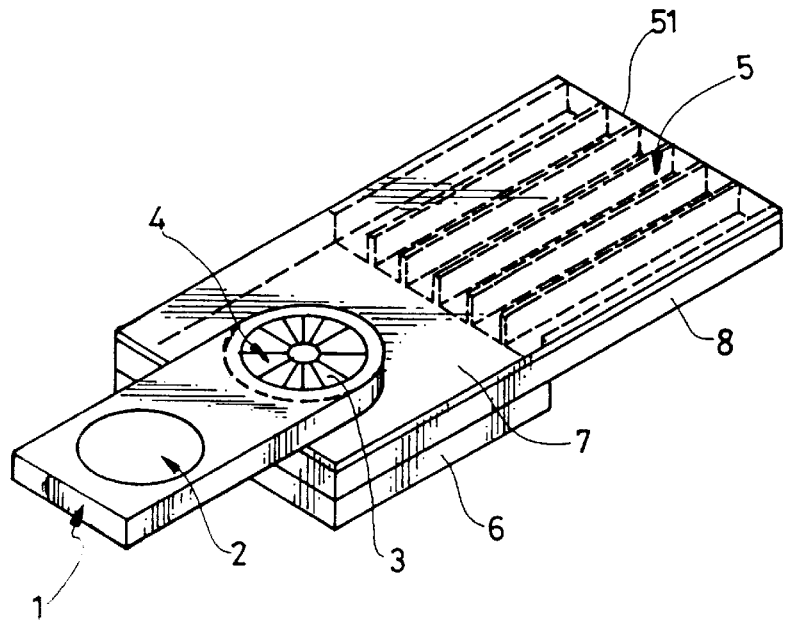
FIG. 3 is a perspective view of the heat dissipating device shown in FIG. 2.

Referring to FIGS. 2 and 3, the preferred embodiment of the heat dissipating device made according to the present invention generally comprises a bracket 8 that is preferably made from aluminum, a cooling fan 3, a covering lid 7, and a specially designed air hose 1. The bracket 8 can be readily attached onto the top surface of the CPU. The specially designed air hose 1 is connected with the mounting recess 4 of the cooling fan 3. The bracket 8 is provided with a plurality of air channels 5 that are directed toward the outlet 51. The air channels 5 are covered with covering lid 7 to enclose the upper end of the air channels 5 to form a closed air channel. The specially designed hose 1 is connected to the mounting recess 4 of the bracket 8 at one end. The cooling fan 3 is mounted within the mounting recess 4. The other end of the special designed hose 1 is connected to the inlet of the computer housing. It shall be noted that the shape, design, length of the hose 1 can be readily modified to meet the actual requirements, i.e. the position of the inlet 91 of the computer housing 91.

Figure 4:
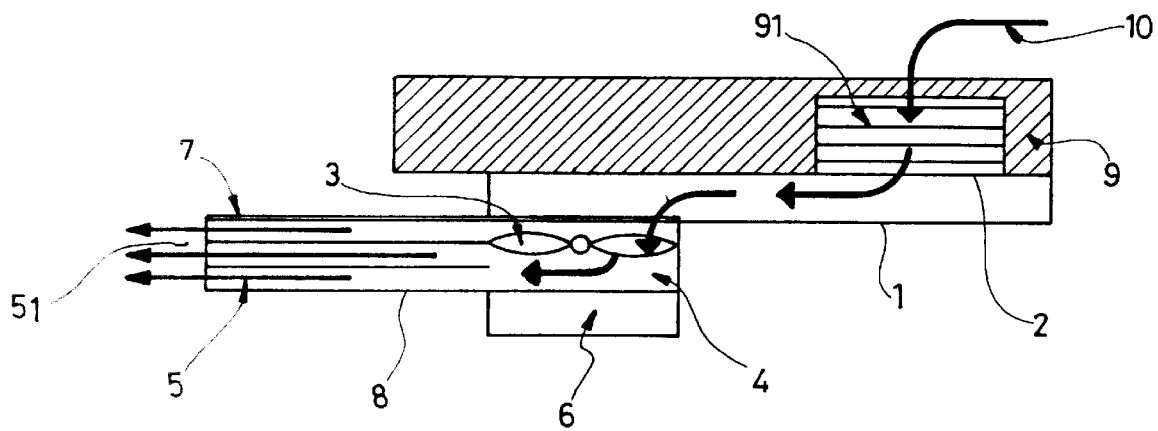
FIG. 4 is a side elevational view showing the heat dissipating device is arranged on the computer housing and the air flow.
Figure 6A:
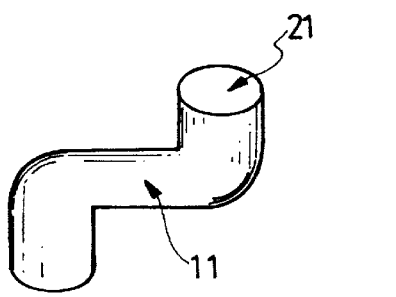
FIGS. 6A to 6C are schematic illustration showing an alternative of the shape of the air channel.
Figure 6B:
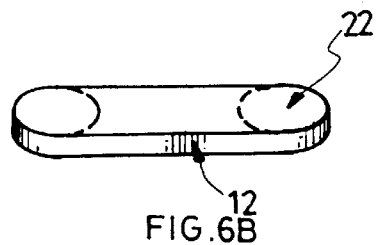
Figure 6C:
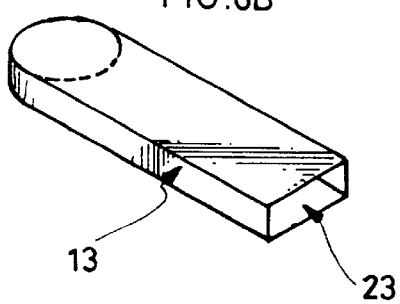

Referring to FIG. 4, the situation of the heat dissipating device shown in FIGS. 2 and 3 operates is shown. FIG. 6 has disclosed three other embodiments 11, 12, 13 of the heat dissipating device. The inlet is disposed at 21, 22 and 23 respectively.

When the cooling fan 3 operates, the fresh and cool air can be readily drawn through the inlet 91 of the computer housing 9 by the operation of the cooling fan 3 disposed within the mounting recess 4. Afterward, that introduced cooling air is directed to the air channels 5 of the bracket 5 through the inlet 2 of the hose 1. Because the upper portion of the air channel 5 is closed by the covering lid 7, the air channel 5 has a tunnel shape. By this arrangement, when the cooling fan 3 operates, the cooling air will be introduced through the inlet 91 of the computer housing 9 along the route 10. This cooling air will then flow through the hose 1 toward the mounting recess 4 in which the cooling fan 3 is mounted thereof. As a result, the heat generated by the CPU 6 will be effectively dissipated by the airflow that passes through the air channel 5. Finally, the heated airflow will be discharged through the outlet (51).

From the forgoing description, it can be readily appreciated that the heat dissipating device made according to the present invention may readily introduce fresh air to the CPU by the provision of a specially designed hose. Accordingly, the working temperature of the CPU can quickly be reduced.

Figure 5:
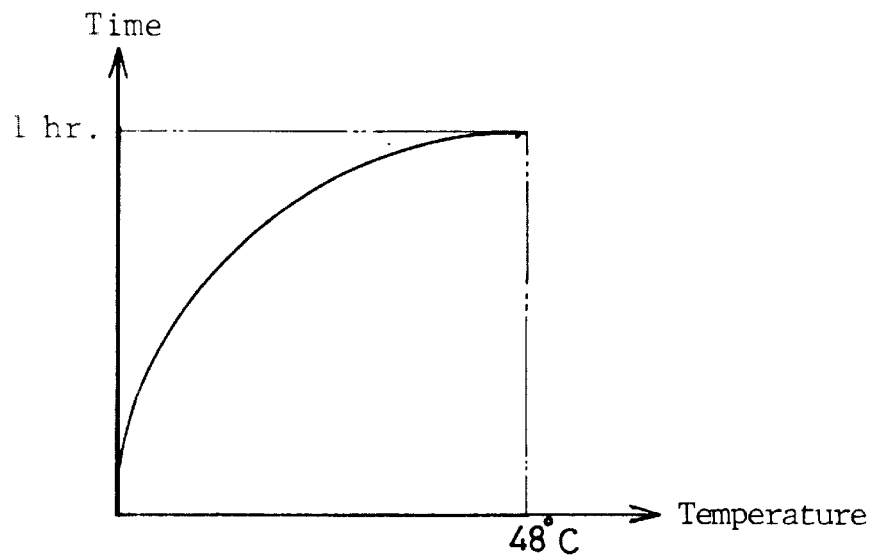
FIG. 5 is a graph showing the working temperature that is function of time of a CPU.

Referring to FIG. 5, the best heat dissipating performance that the heat dissipating device made according to the present invention is shown.

While particular embodiment of the present invention has been illustrated and described, it would be obvious to those skilled in the art that various other changes and modifications can be made without departing from the spirit and scope of the invention. It is therefore intended to cover in the appended claims all such changes and modifications that are within the scope of the present invention.

I claim:

1. A heat dissipating device for CPU, comprising:

a bracket that is provided with a plurality of traverse heat dissipating fins that define a plurality of air channels therebetween at one end, the other end of said bracket being provided with a mounting recess, a covering lid being disposed above said air channels;

a cooling fan being disposed within said mounting recess of said bracket; and a specially designed hose that is connected to the upper portion of said mounting recess of said bracket at one end, the other end of said hose being arranged and connected to an inlet of the computer housing for introducing fresh air therefrom.

2. A heat dissipating device as recited in claim 1, wherein the shape of said hose can be designed to have a tubular, rectangular or elliptical form and the other end of said hose is connected with the inlet of the computer housing.

* * * * *